US012578364B2

(12) United States Patent
Ishizeki et al.

(10) Patent No.: US 12,578,364 B2
(45) Date of Patent: Mar. 17, 2026

(54) CURRENT SENSE CIRCUIT

(71) Applicant: Renesas Electronics Corporation, Tokyo (JP)

(72) Inventors: Yoshiaki Ishizeki, Tokyo (JP); Makoto Tanaka, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 14 days.

(21) Appl. No.: 18/883,388

(22) Filed: Sep. 12, 2024

(65) Prior Publication Data

US 2025/0147079 A1 May 8, 2025

(30) Foreign Application Priority Data

Nov. 8, 2023 (JP) .................................. 2023-190829

(51) Int. Cl.
G01R 19/165 (2006.01)
(52) U.S. Cl.
CPC . G01R 19/16519 (2013.01); G01R 19/16542 (2013.01)
(58) Field of Classification Search
CPC ............ G01R 19/165; G01R 19/16504; G01R 19/16519; G01R 19/16542; H02H 9/02; H02H 9/025; H03K 17/08; H03K 17/081; H03K 17/08104; H03K 17/08112; H02J 1/108; H02J 7/0034

USPC ...................................................... 327/77–81
See application file for complete search history.

(56) References Cited

U.S. PATENT DOCUMENTS

| | | | |
|---|---|---|---|
| 11,881,707 B2 * | 1/2024 | Li ........................... | B60L 58/10 |
| 11,996,830 B2 * | 5/2024 | Murthy ............ | H03K 17/08122 |
| 12,040,578 B2 * | 7/2024 | Vispute ................ | H10D 89/811 |

FOREIGN PATENT DOCUMENTS

JP          2020145219 A          9/2020

* cited by examiner

*Primary Examiner* — Hai L Nguyen
(74) *Attorney, Agent, or Firm* — SCULLY, SCOTT, MURPHY & PRESSER, P.C.

(57) ABSTRACT

A current sense circuit is provided. The circuit includes a current mirror circuit QN1, QN2, and diode-connected QP1, QP2, QP3, and QP4 with their bases connected together, stacking such that the diode-connected side (QN1, QP1, QP3) aligns and connecting the emitter of QP2 to the collector of QP4. Furthermore, the gates of MP1 and MP2 are connected to the collector of QN2 and QP2, respectively. Additionally, the source of MP1 is connected to the drain of MP3 via the source of MP2 and also connected to the source of a Sense MOS. Moreover, the emitter of QP4 is connected to the source of MP4 via R1, and the drain of MP4 is connected to the source (OUT terminal) of a Main MOS. Furthermore, the gates of MP3 and MP4 are connected to the emitters of QN1 and QN2.

7 Claims, 6 Drawing Sheets

CURRENT SENSE CIRCUIT

CROSS-REFERENCE TO RELATED APPLICATION

This application claims priority under 35 U.S.C. § 119 to Japanese Patent Application No. 2023-190829, filed on Nov. 8, 2023. The disclosure of Japanese Patent Application No. 2023-190829, including the specification, drawings and abstract is incorporated herein by reference in its entirety.

BACKGROUND

The present disclosure relates to a current sense circuit. There are disclosed techniques listed below.
[Patent Document 1] Japanese Unexamined Patent Application Publication No. 2020-145219
A technique has been practiced for extracting a sense current from a power MOS (Metal Oxide Semiconductor) transistor equipped with a current sense function. The power MOS transistor includes a Main MOS and a Sense MOS, and combines their Drain-Source Voltages (hereinafter, VDS). Patent Document 1 discloses a technology for constructing a voltage and current negative feedback control circuit using an operational amplifier.

SUMMARY

As disclosed in Patent Document 1, when using an operational amplifier, it is necessary to generate a power supply for the operational amplifier, which results in an increased circuit size. Furthermore, in automotive applications, starting the engine in low temperatures with a deteriorated battery was difficult due to low voltage. Additionally, in automotive applications, protection against battery reverse connection was required. Therefore, the purpose of this disclosure is to provide a current sense circuit that is compact, operates at low voltages, and protects the circuit during battery reverse connection.

Other objects and novel features will become apparent from the description of this specification and the accompanying drawings.

According to one embodiment, in a normal power polarity state, the transistor turns on and acts as a resistor, and in the case of reverse connection, the transistor turns off, resulting in a current sense circuit where no current flows.

According to the aforementioned embodiment, it is possible to provide a current sense circuit protected from deterioration or destruction.

DETAILED DESCRIPTION

Figure 1:
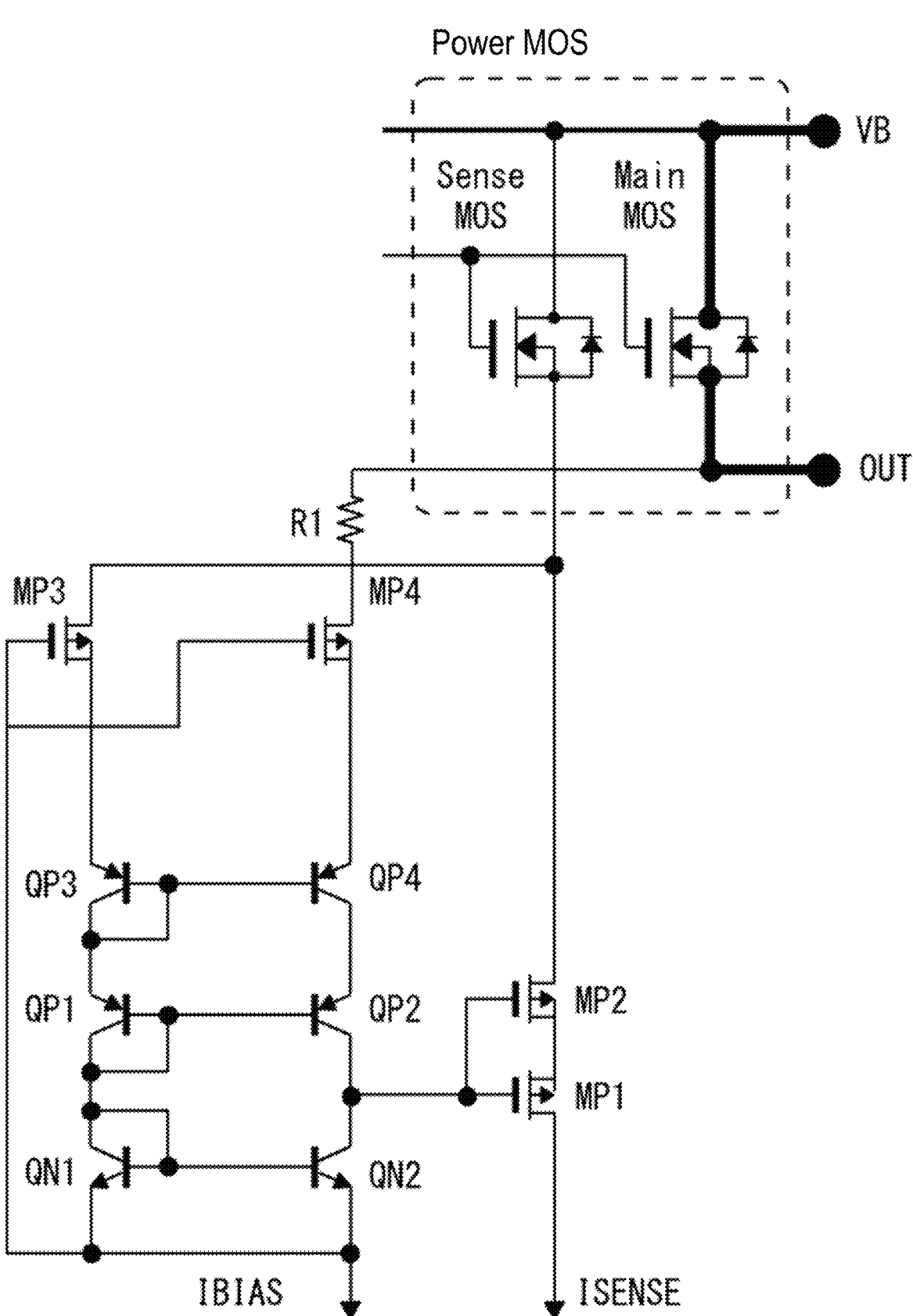
FIG. 1 is a circuit diagram of a current sense circuit according to a first embodiment.

For clarity of explanation, the following description and drawings are appropriately omitted and simplified. Furthermore, the elements depicted in the drawings as functional blocks performing various processes can be implemented, for example, in hardware by a CPU (Central Processing Unit), memory, and other circuits, and in software by programs loaded into the memory. Therefore, these functional blocks can be realized by hardware, software operating on the hardware, or a combination thereof. In the drawings, the same elements are denoted by the same reference numerals, and a repetitive description thereof is omitted as necessary.

Also, the programs described above may be stored and provided to a computer using various types of non-transitory computer readable media. Non-transitory computer readable media includes various types of tangible storage media. Examples of non-transitory computer readable media include magnetic recording media (for example, flexible disks, magnetic tapes, hard disk drives), magneto-optical recording media (for example, magneto-optical disks), CD-ROM (Read Only Memory), CD-R, CD-R/W, and semiconductor memory (for example, mask ROM, PROM (Programmable ROM), EPROM (Erasable PROM), flash ROM, RAM (Random Access Memory)). The programs may also be supplied to the computer by various types of transitory computer-readable media. Examples of transitory computer-readable media include electrical signals, optical signals, and electromagnetic waves. The transitory computer readable medium may provide the program to the computer via wired or wireless communication paths, such as electrical wires and optical fibers.

Description of the Current Sense Circuit Related to the First Embodiment

Figure 5:
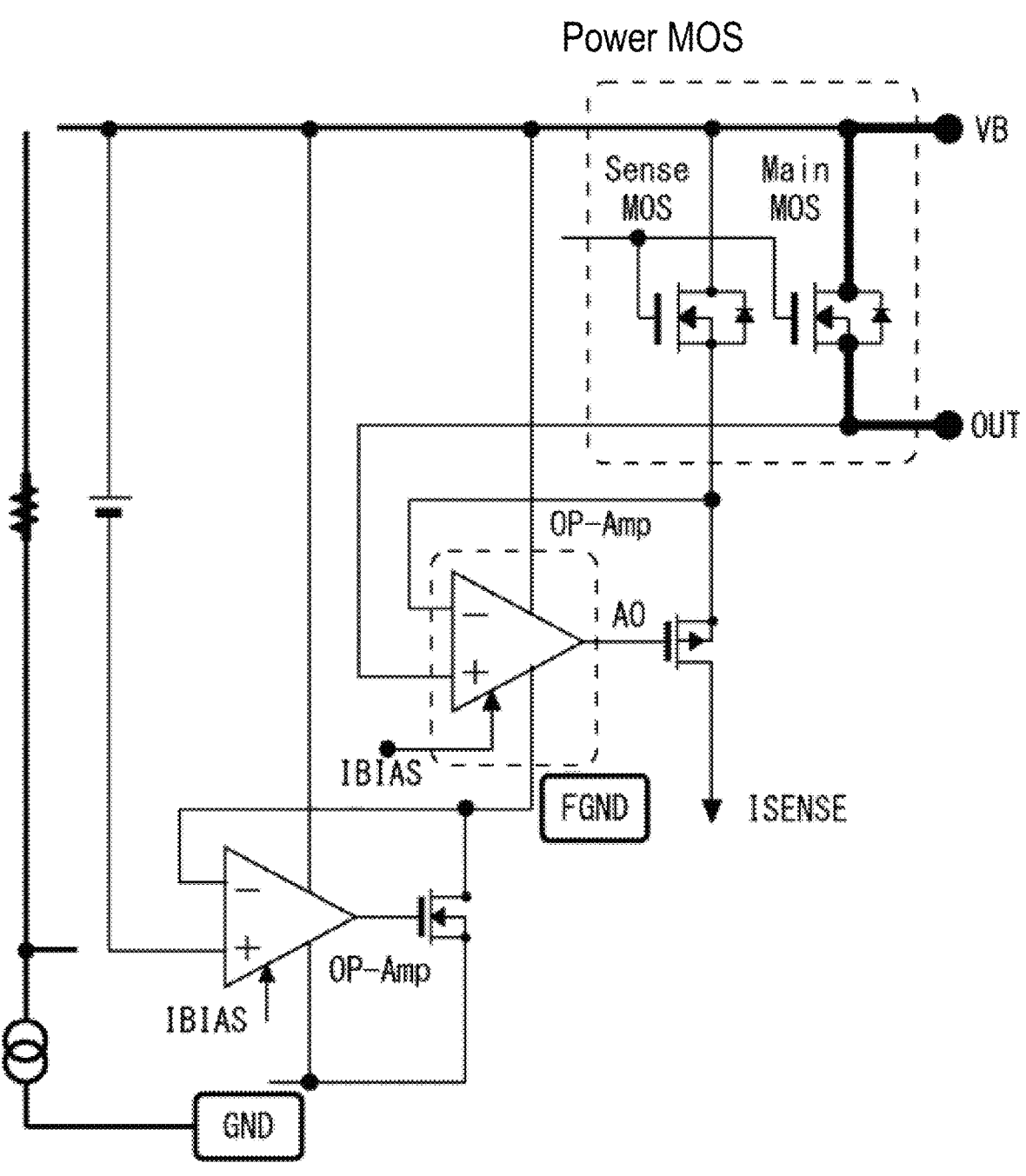
FIG. 5 is a circuit diagram of a related first current sense circuit.
Figure 6:
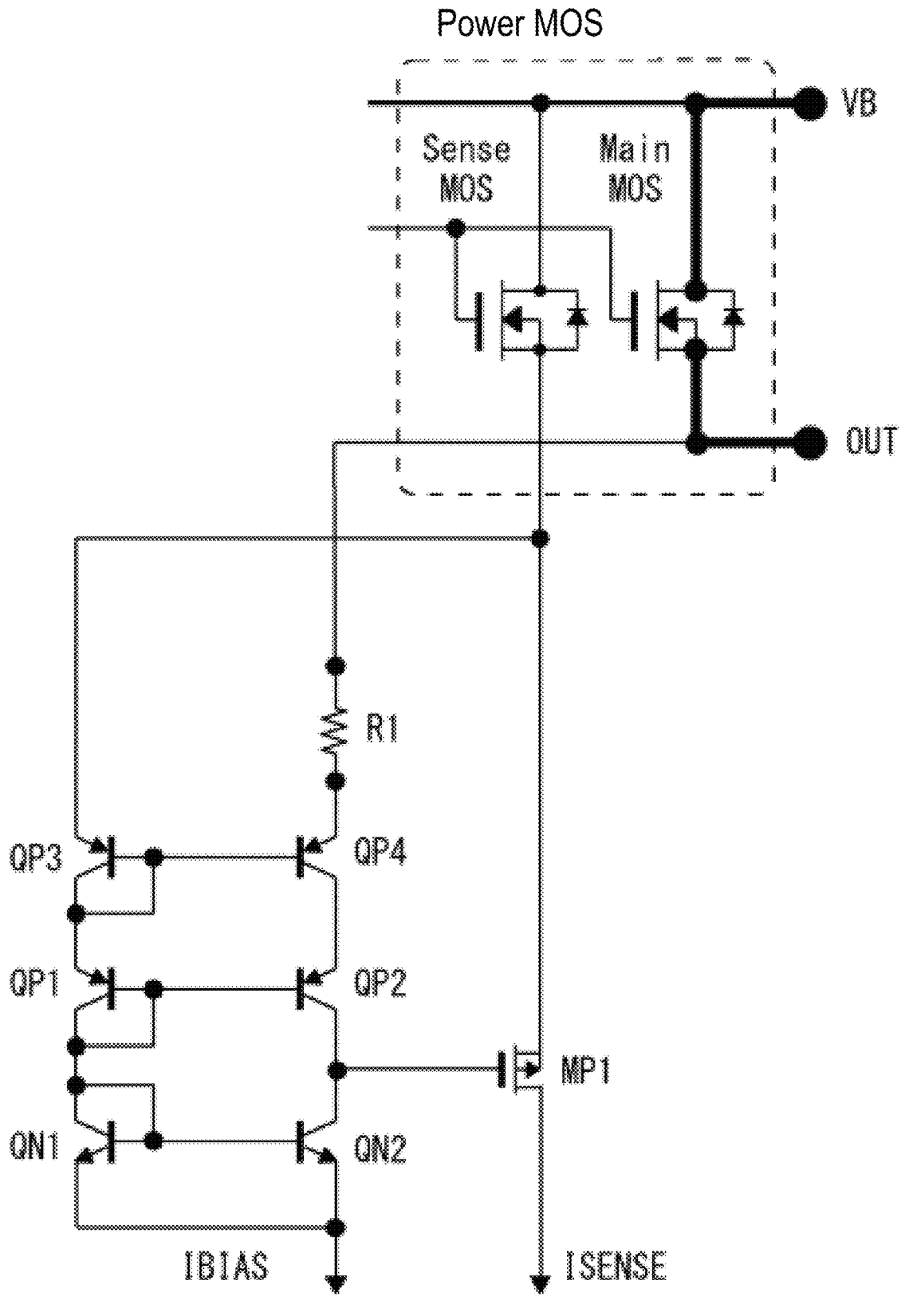
FIG. 6 is a circuit diagram of a related second current sense circuit.

FIG. 1 is a circuit diagram of the current sense circuit related to the first embodiment. FIG. 5 is a circuit diagram of a related first current sense circuit. FIG. 6 is a circuit diagram of a related second current sense circuit. The current sense circuit related to the embodiment will be described with reference to FIGS. 1, 5 and 6.

A power MOS transistor with a current sense function (hereinafter referred to as "Power MOS") incorporates a Sense MOS transistor (hereinafter referred to as "Sense MOS") that is smaller in area ratio along with the Main MOS transistor (hereinafter referred to as "Main MOS") in the main current path. When the area of the Sense MOS is ¹⁄₁₀₀₀ of the area of the Main MOS, ¹⁄₁₀₀₀ of the current flowing through the Main MOS is extracted from the Sense MOS. However, since the Power MOS operates as a resistor in the linear region when ON, it is necessary to match the VDS of the Sense MOS and the Main MOS to obtain the sense current according to the area ratio. For this reason, Patent Document 1 performs voltage negative feedback control using an operational amplifier.

Furthermore, as shown in FIG. 6, current negative feedback control is also performed to match the VDS of the Sense MOS with the VDS of the Main MOS. When the same current is passed through transistors of the same structure and area, the forward voltage (hereinafter referred to as "Vf") of the base-emitter diode is the same. Within the range where the influence of the base current of each bipolar transistor and the influence of the collector-emitter voltage of the collector current can be ignored, the diode side (QN1, QP1, QP3) of the current mirror circuit QN1, QN2 and QP1, QP2, QP3, and QP4 connected at the bases are stacked together. The collector of QN2 and QP2 is connected to the gate of MP1, the source of MP1 is connected to the emitter of QP3 as well as to the source of the Sense MOS.

The emitter of QP4 is connected to the source of the Main MOS (OUT terminal) through resistor R1. In such a circuit, a BIAS current (hereinafter referred to as "IBIAS") is supplied from the common emitter of QN1 and QN2, and a sense current (hereinafter referred to as "ISENSE") is extracted from the drain of MP1. At this time, the transistor structure and area of QN1 and QN2 are matched, the transistor structure and area of QP1 and QP2 are matched, and the transistor structure and area of QP3 and QP4 are matched. Furthermore, the resistance value of R1 is matched to the ON resistance of the Sense MOS minus the ON resistance of the Main MOS. By doing so, it is possible to obtain the sense current according to the area ratio of the Main MOS and the Sense MOS.

In this configuration, QP1 and QP2 utilize the Vf of QP1 for the purpose of ensuring the gate-source voltage (hereinafter referred to as "Vgs") necessary for turning MP1 ON and suppressing the voltage dependency of the second terminal current of QP4 due to fluctuations in the gate-source voltage of MP1, forming a source follower configuration. QP2 and QP4 can be turned ON/OFF with a Vgs higher than the two-stage Vf of QP2 and QP4.

Furthermore, if the voltage dependency of the collector current of QP4 can be ignored, QP1 and QP2 can be removed. In that case, the collector and base of QP3 and the base of QP4 are connected to the collector and base of QN1 and the base of QN2, and the collector of QP4 and the collector of QN2 and the gate of MP1 are connected.

By flowing IBIAS, current flows to the base of QP4 via QN1 and QP1, and the base voltage of QP4 and QP3 is determined by the voltage at the OUT terminal. When the emitter voltage of QP3 equals the emitter voltage of QP4, the emitter current of QP4 also becomes the same, hence, the collector current of QP2 receiving these balances with the collector current of QN2. Similarly, when the emitter voltage of QP3 (=the source voltage of the Sense MOS) is greater than the emitter voltage of QP4 (=the source voltage of the Main MOS=OUT terminal−R1×IBIAS/2), the collector current of QP2 becomes less than the collector current of QN2.

At this time, the gate voltage of MP1 decreases, causing the Ids current to increase, and by drawing current from the Sense MOS, the source voltage of the Sense MOS decreases until it matches the source voltage of the Main MOS. Conversely, when the emitter voltage of QP3 is less than the emitter voltage of QP4, the collector current of QP2 becomes greater than the collector current of QN2. The gate voltage of MP1 increases, causing the Ids current to decrease, and by reducing the current drawn from the Sense MOS, the source voltage of the Sense MOS increases until it matches the source voltage of the Main MOS. Through this series of negative feedback operations, the VDS of the Sense MOS and the Main MOS can be equalized, and a sense current proportional to the area ratio can be extracted.

The current sense circuit has protective functions such as system safety monitoring and prevention of destruction during anomalies as its applications. It is often required that they operate stably under voltage conditions lower than the normal operating power supply voltage range. In particular, in automotive applications, there is an operational limit under low voltage conditions that occur when a deteriorated battery is used for cold engine starts. Furthermore, there is a reverse electromotive force generated when the current of an inductive load, caused by using long wire harnesses or motors, is interrupted.

Additionally, the ability to follow large power supply voltage fluctuations caused by electromagnetic compatibility (EMC) noise entering from the power line and output line via the wire harness, and resistance to destruction (Immunity) are also important.

As a method to match the VDS of the Sense MOS with the VDS of the Main MOS, voltage negative feedback control by an operational amplifier is used, as shown in FIG. 1 of Patent Document 1. This is because using a high-voltage transistor in the operational amplifier would increase the size of the circuit. At this time, if the Power MOS that senses current is on the high voltage side (high side), a VDS is generated with the battery voltage (hereinafter, VB) as the reference potential. The low potential side of the operational amplifier power supply receiving VDS also requires a floating ground (hereinafter, FGND) that is linked to VB.

However, in the configuration of FIG. 5, a voltage lower than the FGND voltage is required to generate FGND. Therefore, especially in current sense applications where protective and monitoring functions are required to operate in a lower voltage power supply range than normal operation, there is a problem that the current sense circuit cannot operate at low voltage because the minimum operating voltage at which the system operates is high.

Furthermore, power supply voltage fluctuations leak to the output due to the PSRR (Power Supply Rejection Ratio) performance of the operational amplifier. Also, if the negative feedback control cannot keep up with sudden changes in input voltage due to frequency characteristics, a phase difference occurs between the input and output signals. As a result, the VDS of the Sense MOS and the VDS of the Main MOS do not match, and there is a problem that the accuracy of the sensed current deteriorates.

In the case of using current negative feedback control as shown in FIG. 6, it is not necessary to generate the aforementioned FGND. Furthermore, the current negative feedback control shown in FIG. 6 is suitable for operation from low voltages since the operating point voltage of the circuit is naturally determined by simply supplying IBIAS.

Moreover, the current negative feedback control shown in FIG. 6 operates with a fewer number of elements, thus eliminating the need for phase compensation capacitance within the circuit like voltage negative feedback type operational amplifiers, making it easier to miniaturize and providing good frequency characteristics. However, in applications such as automotive uses where there is a lot of noise in the surrounding environment, if EMC (Electromagnetic Compatibility) noise containing high-frequency components entering via the wire harness cannot be appropriately canceled, a transient difference between the VDS of the Sense MOS and the VDS of the Main MOS may occur, deteriorating the accuracy of the sense current. In particular, when measures against degradation and destruction due to reverse power connection, which are essential for automotive applications, are required, a countermeasure circuit in addition to the current sense circuit becomes necessary. In the case of semiconductor products, countermeasure components such as a backflow prevention diode and a current limiting resistor are required for the GND of the control circuit.

As shown in FIG. 1, the current sense circuit according to the first embodiment includes a first NPN bipolar transistor QN1 having an emitter that outputs IBIAS and a collector connected to the base. Furthermore, the current sense circuit includes a second NPN bipolar transistor QN2 having an emitter connected to the emitter of QN1 and a base connected to the base of QN1.

Moreover, the current sense circuit includes a first PNP bipolar transistor QP1 having a collector connected to the collector of QN1 and a base connected to the collector.

Additionally, the current sense circuit includes a second PNP bipolar transistor QP2 having a collector connected to the collector of QN2 and a base connected to the base of QP1. Furthermore, the current sense circuit includes a third PNP bipolar transistor QP3 having a collector connected to the emitter of QP1 and a base connected to the collector. Moreover, the current sense circuit includes a fourth PNP bipolar transistor QP4 having a collector connected to the emitter of QP2 and a base connected to the base of QP3.

Additionally, the current sense circuit includes a first P-channel type transistor MP1 having a gate connected to the collector of QN2 and a source that outputs ISENSE. Furthermore, it includes a second P-channel type transistor MP2, wherein MP1 comprises a drain connected to the source of MP2, a gate connected to the collector of QN2, and a source that outputs the sense current, and MP2 comprises a drain connected to the Sense MOS, a gate connected to the collector of QN2, and a source connected to MP1.

Moreover, the current sense circuit includes a third P-channel type transistor MP3 having a gate connected to the emitter of QN1 and a source connected to the emitter of QP3. Additionally, the current sense circuit includes a fourth P-channel type transistor MP4 having a gate connected to the emitter of QN1 and a source connected to the emitter of QP4. Furthermore, the current sense circuit includes a resistor R1 having a first terminal connected to the drain of MP4.

Furthermore, the current sense circuit comprises an N-channel type Sense MOS (Metal Oxide Semiconductor) transistor (hereinafter, also referred to as Sense MOS), which includes a source connected to the drain of MP3 and the drain of MP2. Furthermore, the current sense circuit comprises an N-channel type Main MOS transistor (hereinafter, also referred to as Main MOS), which includes a source connected to the second terminal of R1 and the output. The gate of the Sense MOS transistor is connected to the gate of the Main MOS transistor. The drain of the Sense MOS transistor is connected to the drain of the Main MOS transistor and the battery voltage.

The current mirror circuits QN1, QN2, and the diode-connected sides of QP1, QP2, and QP3, QP4, which are connected at their bases (QN1, QP1, QP3), are stacked together, and the emitter of QP2 is connected to the collector of QP4. The gates of MP1 and MP2 are connected to the collectors of QN2 and QP2. The source of MP1 is connected to the drain of MP3 through the source of MP2 and also connected to the source of Sense MOS. The emitter of QP4 is connected to the source of MP4 via R1, and the drain of MP4 is connected to the source (OUT terminal) of Main MOS. The gates of MP3 and MP4 are connected to the emitters of QN1 and QN2.

At this time, QN1 and QN2, QP1 and QP2, QP3 and QP4, and MP3 and MP4 are made to have the same structure and the same area. By matching the resistance value of R1 to the ON resistance of Sense MOS minus the ON resistance of Main MOS, IBIAS is supplied from the common emitter of QN1 and QN2, and a configuration is provided to extract ISENSE from the drain of MP1.

MP2, MP3, MP4 operate the same as shown in FIG. 6 when the power supply polarity is normal, except that the ON resistance increases as reverse transistors. When the power supply is reverse-connected, MP2, MP3, MP4 turn OFF, thereby forming a configuration that blocks abnormal current flowing from GND to VB.

Specifically, when the power supply polarity is normal, by flowing IBIAS, MP3, MP4 turn ON as reverse transistors because the gate voltage becomes lower than the source voltage by three levels of Vf of QP3, QP1, QN1. Only the same resistance is attached to the emitters of QP3 and QP4, so at steady state, the voltage drops (½×IBIAS×ON resistance of MP3, MP4) is the same, hence the source voltage of Main MOS (OUT terminal) and the source voltage of Sense MOS do not deviate. In this state, the base voltage of QP4 and QP3 is determined by the current flowing through QN1, QP1 to the base of QP4 from the voltage at the OUT terminal and the voltage drop from MP4 and R1×IBIAS/2.

When the emitter voltage of QP3 equals the emitter voltage of QP4, the emitter current of QP4 becomes the same, so the collector current of QP2 receiving these balances with the collector current of QN2. Similarly, when the emitter voltage of QP3 (=the source voltage of Sense MOS−the voltage drop across MP3) is greater than the emitter voltage of QP4 (=the source voltage of Main MOS−R1+the voltage drops across MP4=OUT terminal−(ON resistance of MP4+R1)×IBIAS/2), the collector current of QP2 becomes less than the collector current of QN2. The gate voltages of MP1 and MP2 decrease and turn on, drawing current from the Sense MOS until the source voltage of the Sense MOS matches the source voltage of the Main MOS.

Conversely, when the emitter voltage of QP3 is less than the emitter voltage of QP4, the collector current of QP2 becomes greater than the collector current of QN2. The gate voltage of MP1 increases, reducing the Ids current, and the current drawn from the Sense MOS decreases until the source voltage of the Sense MOS matches the source voltage of the Main MOS. By such a series of negative feedback operations, it is possible to extract a sense current in accordance with the area ratio of the Sense MOS and Main MOS.

On the other hand, in the case of reverse connection of the power supply, the gate voltages of MP2, MP3, and MP4 become less than Vf and turn off, thereby blocking the current path from IBIAS and ISENSE to VB.

With the above configuration, while maintaining the performance of the conventional basic configuration, especially in automotive applications, when the power supply is reversed, MP2, MP3, and MP4 turn off and block the current, thereby protecting the circuit from degradation and destruction.

The above description explained a high-side system that turns on/off with VB as the reference voltage, but similar effects can be obtained by replacing bipolar transistors with MOS transistors. It is also applicable to a low-side system operating with GND as the reference voltage by swapping N-type and P-type.

Description of the Current Sense Circuit According to the Second Embodiment

Figure 2:
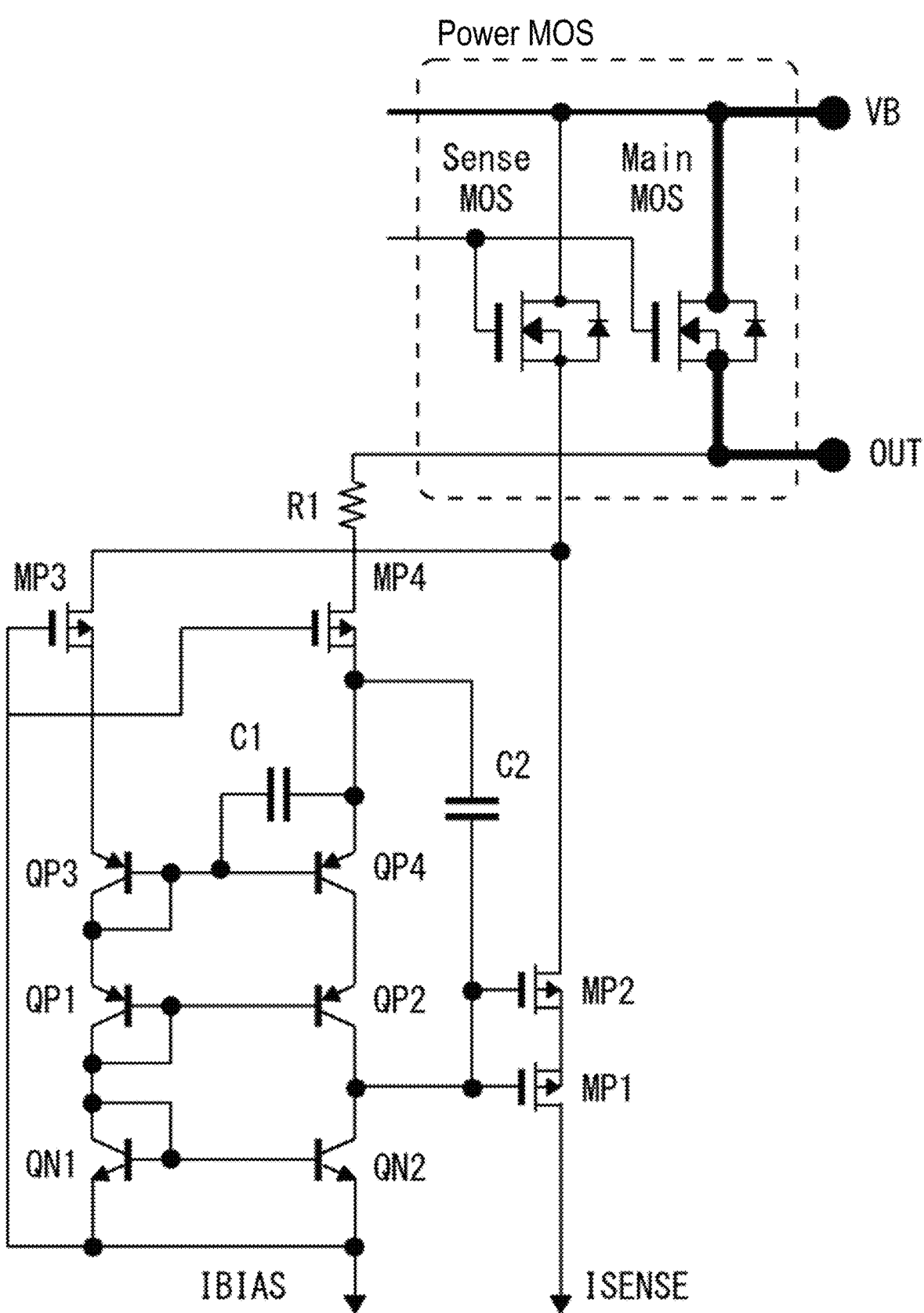
FIG. 2 is a circuit diagram of a current sense circuit according to a second embodiment.

FIG. 2 is a circuit diagram of the current sense circuit according to the second embodiment. The current sense circuit according to the embodiment will be described with reference to FIG. 2.

As shown in FIG. 2, the current sense circuit according to the second embodiment includes a first capacitive element C1 having a first terminal connected to the base of QP3 and a second terminal connected to the emitter of QP4. Furthermore, the current sense circuit according to the second embodiment includes a second capacitive element C2 having a first terminal connected to the gate of MP1 and a second terminal connected to the emitter of QP4.

That is, a first capacitive element C1 is added between the base-emitter of QP4 and a second capacitive element C2 is added between the source of MP4 and the gates of MP1 and MP2. This improves the current sense accuracy during transient voltage fluctuations containing EMC noise and high-frequency components that propagate to VB and the OUT terminal when the Power MOS is ON. The operation during steady state is the same as in the first embodiment, so the description is omitted.

In the first embodiment, when the Power MOS is in the ON state, the source voltage of the Main MOS at the OUT terminal is received by the emitter of QP4, and the source voltage of the Sense MOS is received by the emitter of QP3, generating the gate-source voltage of MP1 from the difference in collector current between QN2 and QP2. The operation to match the source voltage of the Sense MOS to the source voltage of the Main MOS is performed by controlling the current flowing through MP1 in a negative feedback manner. At this time, if a steep voltage change and high-frequency EMC noise enter the source (OUT terminal) of the Main MOS, the generation of the differential collector current between QN2 and QP2 and the generation of the gate-source voltage of MP1 temporarily cannot follow, resulting in an error in the extracted ISENSE.

In the second embodiment, with the aim of improving this problem, a first capacitive element C1 is added between the base and emitter of QP4, and a second capacitive element C2 is added between the source of MP4 and the gates of MP1 and MP2. By adding the first capacitive element C1, it is possible to suppress changes in the voltage between the base and emitter of QP4 during sudden changes in the source voltage (OUT terminal) of the Main MOS. Therefore, the differential collector current driving MP1 from QN2 and QP2 operates to follow the average value rather than following high-frequency and steep voltage changes.

Furthermore, by utilizing the high impedance of the gate of MP1 due to the collector connection of QN2 and QP2 and the fact that VB~VOUT when the Power MOS is in the ON state, a second capacitive element C2 is added. Therefore, even when steep voltage changes and high-frequency EMC noise enter the OUT terminal, the gate voltage change of MP1 is linked to the OUT terminal. This prevents MP1 itself from generating abnormal currents due to transient VGS changes.

At this time, since the capacitance values of the first capacitive element C1 and the second capacitive element C2 change depending on the structure and size of the transistor and the BIAS current, it is necessary to adjust to the values that provide the optimal effect based on the slew rate of the noise to be addressed and the response frequency required for the basic operation.

With the above configuration, compared to the first embodiment, it is possible to improve the current sense accuracy when subjected to the reverse electromotive force generated when the current of the inductive load caused by using long wire harnesses and motors, which is a problem especially in automotive applications, is cut off, and the EMC noise that enters through the power line and output line via the wire harness.

Description of the Current Sense Circuit According to the Third Embodiment

Figure 3:
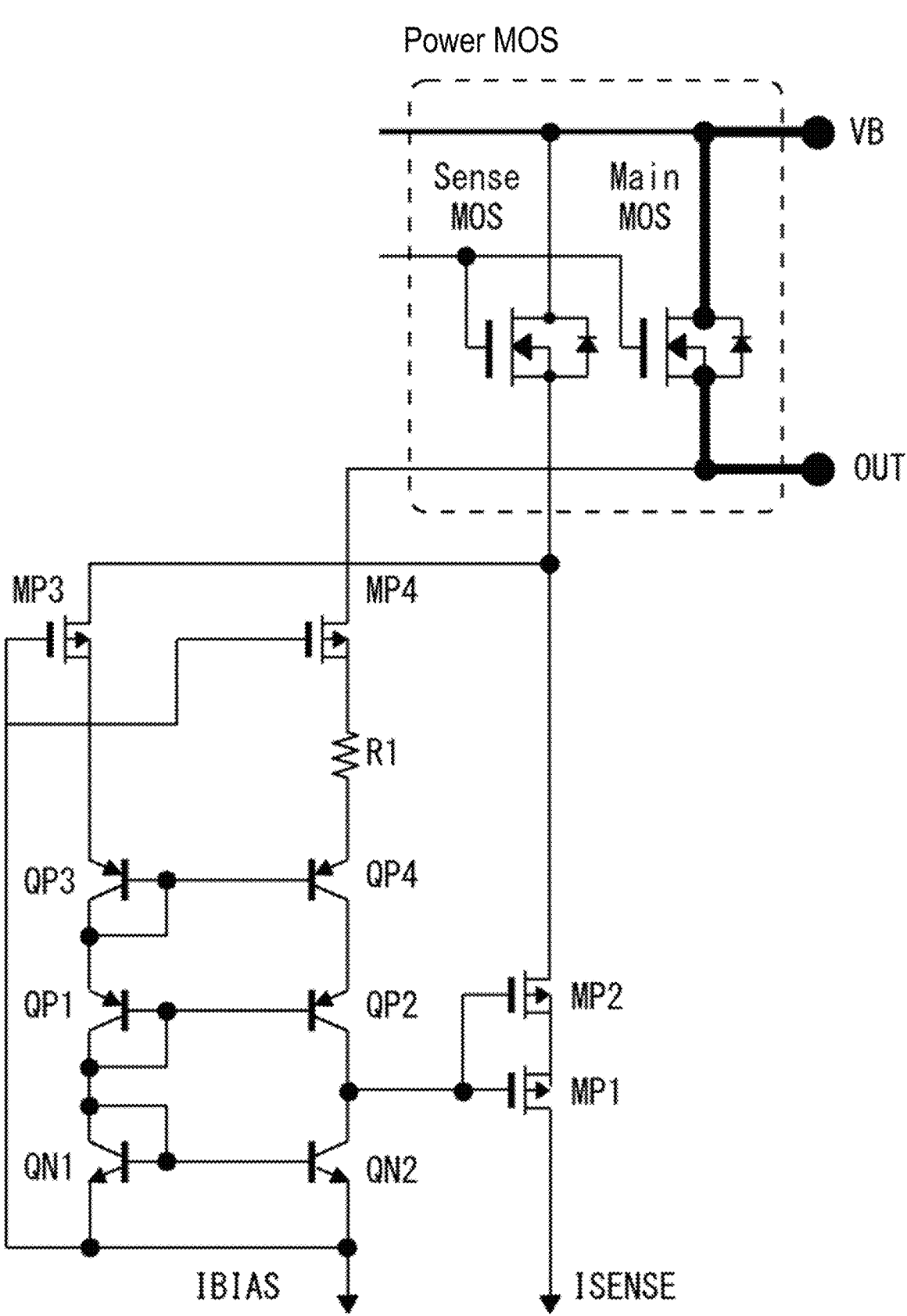
FIG. 3 is a circuit diagram of a current sense circuit according to a third embodiment.

FIG. 3 is a circuit diagram of the current sense circuit according to the third embodiment. Referring to FIG. 3, the current sense circuit according to the embodiment will be described.

As shown in FIG. 3, the current sense circuit according to the third embodiment differs from the first embodiment in the position of the resistor R1. The resistor R1 comprises a first terminal connected to the emitter of the fourth PNP bipolar transistor and a second terminal connected to the source of the fourth P-channel type transistor. Thus, even though the position of the resistor R1 differs from that in the first embodiment, the current sense circuit can operate in a similar manner.

Description of the Current Sense Circuit According to the Fourth Embodiment

Figure 4:
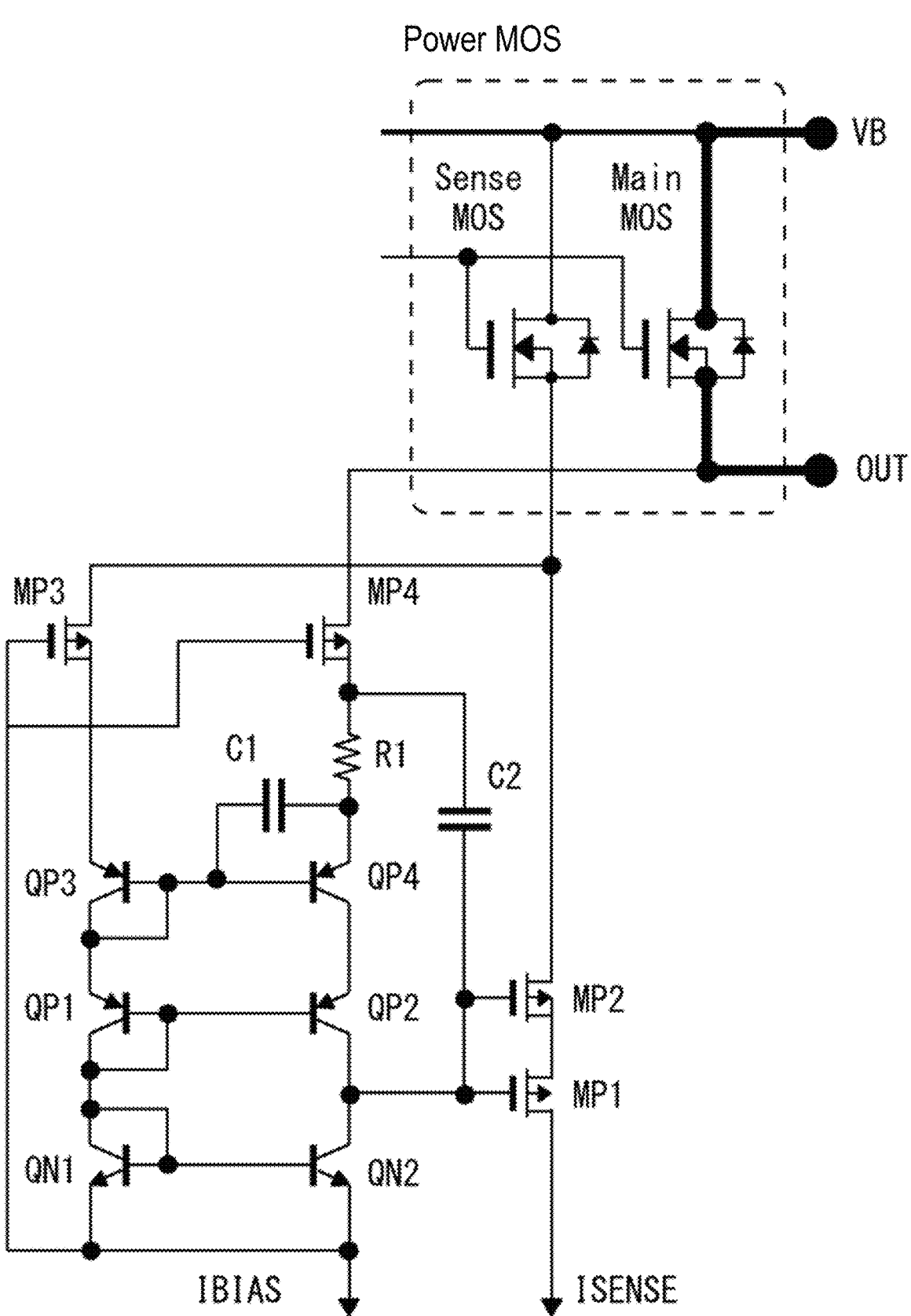
FIG. 4 is a circuit diagram of a current sense circuit according to a fourth embodiment.

FIG. 4 is a circuit diagram of the current sense circuit according to the fourth embodiment. Referring to FIG. 4, the current sense circuit according to the embodiment will be described.

As shown in FIG. 4, the current sense circuit according to the fourth embodiment differs from the second embodiment in the position of the resistor R1. The resistor R1 includes a first terminal connected to the emitter of the fourth PNP bipolar transistor and the second terminal of the first capacitive element, and a first terminal connected to the source of the fourth P-channel transistor and the second terminal of the second capacitive element. Thus, even though the position of the resistor R1 differs from that in the second embodiment, the current sense circuit can operate in a similar manner.

Although the invention made by the inventor has been specifically described based on the embodiment, the present invention is not limited to the embodiment already described, and it is needless to say that various modifications can be made without departing from the gist thereof.

For example, a current sense circuit with reversed polarity includes a first PNP bipolar transistor comprising an emitter outputting BIAS current and a collector connected to the base. Furthermore, the current sense circuit includes a second PNP bipolar transistor comprising an emitter connected to the emitter of the first PNP bipolar transistor and a base connected to the base of the first PNP bipolar transistor.

Additionally, the current sense circuit includes a first NPN bipolar transistor comprising a collector connected to the collector of the first PNP bipolar transistor and a base connected to the collector. Moreover, the current sense circuit includes a second NPN bipolar transistor comprising a collector connected to the collector of the second PNP bipolar transistor and a base connected to the base of the first NPN bipolar transistor. Furthermore, the current sense circuit includes a third NPN bipolar transistor comprising a collector connected to the emitter of the first NPN bipolar transistor and a base connected to the collector.

Additionally, the current sense circuit includes a fourth NPN bipolar transistor comprising a collector connected to the emitter of the second NPN bipolar transistor and a base connected to the base of the third NPN bipolar transistor.

Furthermore, the current sense circuit includes a first N-channel transistor comprising a gate connected to the collector of the second PNP bipolar transistor and a drain outputting SENSE current. Moreover, the current sense circuit includes a second N-channel transistor comprising a gate connected to the collector of the second PNP bipolar transistor and a source connected to the source of the first N-channel transistor.

Additionally, the current sense circuit includes a third N-channel transistor comprising a gate connected to the emitter of the first PNP bipolar transistor and a source connected to the emitter of the third NPN bipolar transistor. Furthermore, the current sense circuit includes a fourth N-channel transistor comprising a gate connected to the emitter of the first PNP bipolar transistor and a source connected to the emitter of the fourth NPN bipolar transistor.

Moreover, the current sense circuit includes a resistor comprising a first terminal connected to the drain of the fourth N-channel transistor. Furthermore, the current sense circuit comprises a P-channel type Sense MOS transistor equipped with a source connected to the drain of the third N-channel type transistor and the drain of the second N-channel type transistor.

Furthermore, the current sense circuit comprises a P-channel type Main MOS transistor equipped with a source connected to the second terminal of the resistor and the output. The gate of the Sense MOS is connected to the gate of the Main MOS. The drain of the Sense MOS is connected to the drain of the Main MOS and the ground voltage.

The current sense circuit, which has been modified from a bipolar transistor to a MOS transistor, comprises a first N-channel type transistor equipped with a source that outputs BIAS current and a drain connected to the gate. Furthermore, the current sense circuit comprises a second N-channel type transistor equipped with a source connected to the source of the first N-channel type transistor and a gate connected to the gate of the first N-channel type transistor.

Furthermore, the current sense circuit comprises a first P-channel type transistor equipped with a drain connected to the drain of the first N-channel type transistor and a gate connected to the drain. Furthermore, the current sense circuit comprises a second P-channel type transistor equipped with a drain connected to the drain of the second N-channel type transistor and a gate connected to the gate of the first P-channel type transistor.

Furthermore, the current sense circuit comprises a third P-channel type transistor equipped with a drain connected to the source of the first P-channel type transistor and a gate connected to the drain. Furthermore, the current sense circuit comprises a fourth P-channel type transistor equipped with a drain connected to the source of the second P-channel type transistor and a gate connected to the gate of the third P-channel type transistor.

Furthermore, the current sense circuit comprises a fifth P-channel type transistor equipped with a gate connected to the drain of the second N-channel type transistor and a drain that outputs SENSE current. Furthermore, the current sense circuit comprises a sixth P-channel type transistor equipped with a gate connected to the drain of the second N-channel type transistor and a source connected to the source of the fifth P-channel type transistor.

Furthermore, the current sense circuit comprises a seventh P-channel type transistor equipped with a gate connected to the source of the first N-channel type transistor and a source connected to the source of the third P-channel type transistor. Furthermore, the current sense circuit comprises an eighth P-channel type transistor equipped with a gate connected to the source of the first N-channel type transistor and a source connected to the source of the fourth P-channel type transistor.

Furthermore, the current sense circuit comprises a resistor equipped with a first terminal connected to the drain of the eighth P-channel type transistor. Furthermore, the current sense circuit comprises an N-channel type Sense MOS transistor equipped with a source connected to the drain of the seventh P-channel type transistor and the drain of the sixth P-channel type transistor.

Furthermore, the current sense circuit comprises an N-channel type Main MOS transistor equipped with a source connected to the second terminal of the resistor and the output. And the gate of the Sense MOS is connected to the gate of the Main MOS. The drain of the Sense MOS is connected to the drain of the Main MOS and the battery voltage.

The current sense circuit modified to a MOS transistor can replace a P-channel type with an N-channel type, and an N-channel type with a P-channel type. Furthermore, the current sense circuit modified to a MOS transistor can replace the battery voltage with the ground voltage.

What is claimed is:

1. A current sense circuit comprising:
a first NPN bipolar transistor equipped with an emitter that outputs a BIAS current and a collector connected to a base; a second NPN bipolar transistor equipped with an emitter connected to the emitter of the first NPN bipolar transistor and a base connected to the base of the first NPN bipolar transistor;
a first PNP bipolar transistor equipped with a collector connected to the collector of the first NPN bipolar transistor and a base connected to the collector;
a second PNP bipolar transistor equipped with a collector connected to the collector of the second NPN bipolar transistor and a base connected to the base of the first PNP bipolar transistor;
a third PNP bipolar transistor equipped with a collector connected to the emitter of the first PNP bipolar transistor and a base connected to the collector;
a fourth PNP bipolar transistor equipped with a collector connected to the emitter of the second PNP bipolar transistor and a base connected to the base of the third PNP bipolar transistor;
a first P-channel type transistor equipped with a gate connected to the collector of the second NPN bipolar transistor and a drain that outputs a SENSE current;
a second P-channel type transistor equipped with a gate connected to the collector of the second NPN bipolar transistor and a source connected to the source of the first P-channel type transistor;
a third P-channel type transistor equipped with a gate connected to the emitter of the first NPN bipolar transistor and a source connected to the emitter of the third PNP bipolar transistor;
a fourth P-channel type transistor equipped with a gate connected to the emitter of the first NPN bipolar transistor and a source connected to the emitter of the fourth PNP bipolar transistor;
a resistor equipped with a first terminal connected to the drain of the fourth P-channel type transistor;
an N-channel type Sense MOS (Metal Oxide Semiconductor) transistor equipped with a source connected to the drain of the third P-channel type transistor and the drain of the second P-channel type transistor; and
an N-channel type Main MOS transistor equipped with a source connected to the second terminal of the resistor and an output, wherein the gate of the Sense MOS transistor is connected to the gate of the Main MOS transistor, and the drain of the Sense MOS transistor is connected to the drain of the Main MOS transistor and a battery voltage.

2. The current sense circuit according to claim 1, further comprising:
a first capacitive element having a first terminal connected to the base of the third PNP bipolar transistor and a second terminal connected to the emitter of the fourth PNP bipolar transistor; and a second capacitive element having a first terminal connected to the gate of the first P-channel transistor and a second terminal connected to the emitter of the fourth PNP bipolar transistor.

3. A current sense circuit comprising:

a first PNP bipolar transistor with an emitter that outputs a BIAS current and a collector connected to the base;

a second PNP bipolar transistor with an emitter connected to the emitter of the first PNP bipolar transistor and a base connected to the base of the first PNP bipolar transistor;

a first NPN bipolar transistor with a collector connected to the collector of the first PNP bipolar transistor and a base connected to the collector;

a second NPN bipolar transistor with a collector connected to the collector of the second PNP bipolar transistor and a base connected to the base of the first NPN bipolar transistor;

a third NPN bipolar transistor with a collector connected to the emitter of the first NPN bipolar transistor and a base connected to the collector; a fourth NPN bipolar transistor with a collector connected to the emitter of the second NPN bipolar transistor and a base connected to the base of the third NPN bipolar transistor;

a first N-channel transistor with a gate connected to the collector of the second PNP bipolar transistor, a drain that outputs a SENSE current, and a source;

a second N-channel transistor with a gate connected to the collector of the second PNP bipolar transistor and a source connected to the source of the first N-channel transistor;

a third N-channel transistor with a gate connected to the emitter of the first PNP bipolar transistor and a source connected to the emitter of the third NPN bipolar transistor;

a fourth N-channel transistor with a gate connected to the emitter of the first PNP bipolar transistor and a source connected to the emitter of the fourth NPN bipolar transistor;

a resistor with a first terminal connected to the drain of the fourth N-channel transistor;

a P-channel Sense MOS transistor with a source connected to the drains of the third N-channel transistor and the second N-channel transistor; and a P-channel Main MOS transistor with a second terminal of the resistor and an output connected to its source, wherein the gate of the Sense MOS transistor is connected to the gate of the Main MOS transistor, and the drain of the Sense MOS transistor is connected to the drain of the Main MOS transistor and ground voltage.

4. The current sense circuit according to claim 3, further comprising:

a first capacitive element connected to the base of the third NPN bipolar transistor and the emitter of the fourth NPN bipolar transistor; and a second capacitive element connected to the gate of the first N-channel type transistor and the emitter of the fourth NPN bipolar transistor.

5. A current sense circuit comprising:

a source that outputs a BIAS current;

a first N-channel transistor having a drain connected to a gate;

a second N-channel transistor comprising a source connected to the source of the first N-channel transistor and a gate connected to the gate of the first N-channel transistor;

a first P-channel transistor comprising a drain connected to the drain of the first N-channel transistor and a gate connected to the drain;

a second P-channel transistor comprising a drain connected to the drain of the second N-channel transistor and a gate connected to the gate of the first P-channel transistor;

a third P-channel transistor comprising a drain connected to the source of the first P-channel transistor and a gate connected to the drain;

a fourth P-channel transistor comprising a drain connected to the source of the second P-channel transistor and a gate connected to the gate of the third P-channel transistor;

a fifth P-channel transistor comprising a gate connected to the drain of the second N-channel transistor and a drain that outputs a SENSE current;

a sixth P-channel transistor comprising a gate connected to the drain of the second N-channel transistor and a source connected to the source of the fifth P-channel transistor;

a seventh P-channel transistor comprising a gate connected to the source of the first N-channel transistor and a source connected to the source of the third P-channel transistor;

an eighth P-channel transistor comprising a gate connected to the source of the first N-channel transistor and a source connected to the source of the fourth P-channel transistor;

a resistor comprising a first terminal connected to the drain of the eighth P-channel transistor;

an N-channel Sense MOS transistor comprising a source connected to the drain of the seventh P-channel transistor and the drain of the sixth P-channel transistor; and an N-channel Main MOS transistor comprising a source connected to the second terminal of the resistor and an output, wherein the gate of the Sense MOS transistor is connected to the gate of the Main MOS transistor, and the drain of the Sense MOS transistor is connected to the drain of the Main MOS transistor and a battery voltage.

6. The current sense circuit according to claim 5, further comprising:

a first capacitive element connected to the gate of the third P-channel transistor and the source of the fourth P-channel transistor, and a second capacitive element connected to the gate of the fifth P-channel transistor and the source of the fourth P-channel transistor.

7. The current sense circuit according to claim 5, wherein the N-channel type is replaced with the P-channel type, the P-channel type is replaced with the N-channel type, and the battery voltage is replaced with the ground voltage.

* * * * *